United States Patent [19]

Kitada et al.

[11] Patent Number: 5,287,237
[45] Date of Patent: Feb. 15, 1994

[54] ANTIFERROMAGNETIC FILM SUPERIOR IN CORROSION RESISTANCE, MAGNETORESISTANCE-EFFECT ELEMENT AND MAGNETORESISTANCE-EFFECT HEAD INCLUDING SUCH THIN FILM

[75] Inventors: Masahiro Kitada, Tokyo; Noboru Shimizu, Tokorozawa; Hideo Tanabe, Higashimurayama; Ryoichi Nakatani, Akigawa; Isamu Yuito, Ome; Naoki Koyama, Kokubunji, all of Japan

[73] Assignee: Hitachi, Ltd., Tokyo, Japan

[21] Appl. No.: 668,069

[22] Filed: Mar. 12, 1991

[30] Foreign Application Priority Data

| Mar. 16, 1990 [JP] | Japan | 2-064180 |
| Oct. 26, 1990 [JP] | Japan | 2-287000 |
| Nov. 2, 1990 [JP] | Japan | 2-295326 |

[51] Int. Cl.⁵ .............. G11B 5/30; G11B 5/147; B32B 15/00
[52] U.S. Cl. ................... 360/113; 360/126; 428/668; 428/694 R
[58] Field of Search .......... 360/113, 131, 134, 135, 360/125, 126; 148/121, 122, 304, 305, 403, 438; 427/131; 428/694, 900, 615, 668

[56] References Cited

U.S. PATENT DOCUMENTS

| 4,103,315 | 7/1978 | Hempstead et al. | 360/113 |
| 4,242,710 | 12/1980 | Hempstead et al. | 360/113 |
| 4,440,720 | 4/1984 | Masumoto et al. | 148/121 |
| 4,755,897 | 7/1988 | Howard | 360/113 |
| 4,816,933 | 3/1989 | Izumi et al. | 360/131 |
| 4,825,325 | 4/1989 | Howard | 360/113 |
| 4,837,094 | 6/1989 | Kudo | 148/304 |
| 4,949,039 | 8/1990 | Grünberg | 360/113 |
| 5,032,945 | 7/1991 | Argyle et al. | 360/125 |

FOREIGN PATENT DOCUMENTS

| 62-40610 | 2/1987 | Japan . |
| 63-117309 | 5/1988 | Japan . |
| 63-273372 | 11/1988 | Japan . |
| 1-213819 | 8/1989 | Japan . |

Primary Examiner—Stuart S. Levy
Assistant Examiner—Jefferson Evans
Attorney, Agent, or Firm—Fay, Sharpe, Beall, Fagan, Minnich & McKee

[57] ABSTRACT

In order to prevent generation of Barkhausen noise of a magnetoresistance-effect element, a thin antiferromagnetic film formed of Fe-Mn-X alloy containing a third alloying element X (which serves to improve corrosion resistance of Fe-Mn alloy) by 0.1 to 20 atomic % is disposed in adjacent to a thin permalloy film. The element X is selected from the group consisting of Ir, Ru, Zr, Nb, Si, Ge, V, Co, Pt and Pd. It is particularly recommended to employ Ir of 4 to 15 atomic % or Ru of 5.5 to 15 atomic % as the element X. When one or more alloying element selected from Ru, Rh, Pt, Ti, Zr, Hf, V, Nb, Ta, Cr, Mo, W, Ni, Cu, Al, Si and Ge is added to Fe and Mn which are essential components of the Fe-Mn-X alloy in addition to the element X, corrosion resistance of the alloy is improved more sufficiently.

12 Claims, 6 Drawing Sheets

F I G. 7
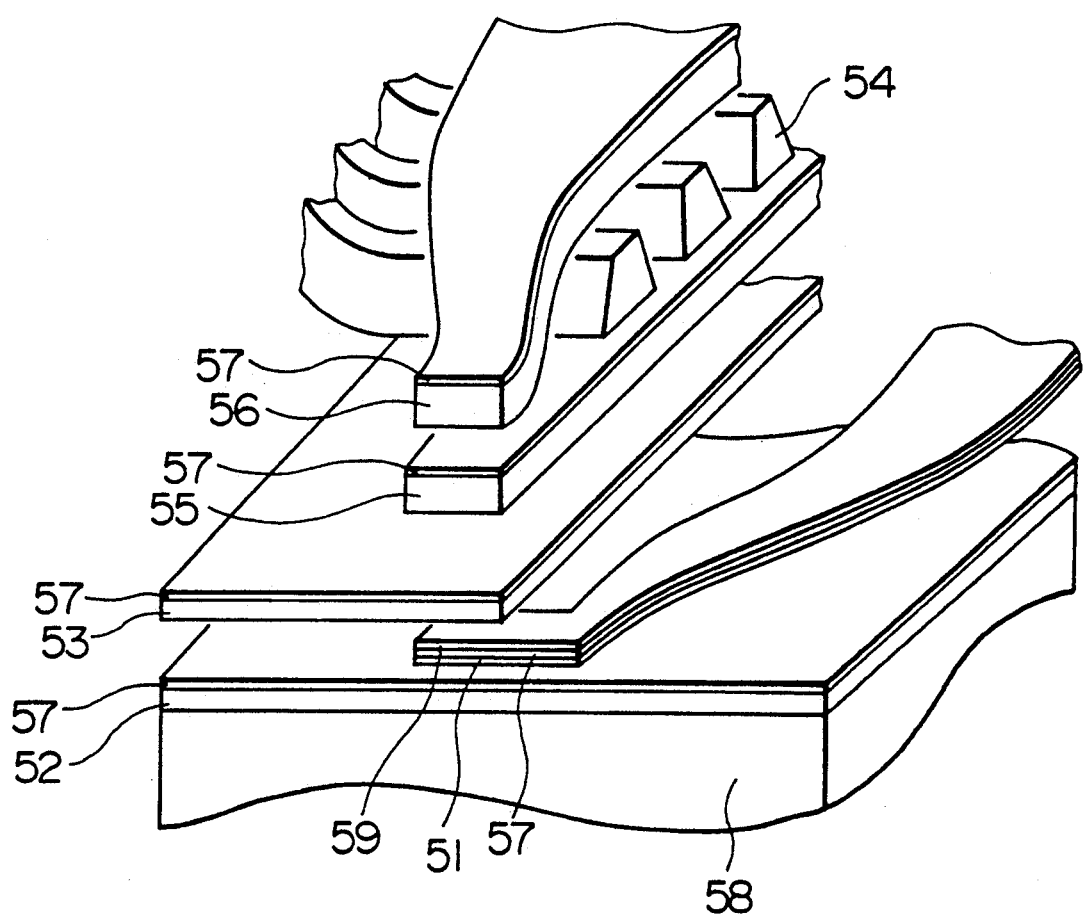

ANTIFERROMAGNETIC FILM SUPERIOR IN CORROSION RESISTANCE, MAGNETORESISTANCE-EFFECT ELEMENT AND MAGNETORESISTANCE-EFFECT HEAD INCLUDING SUCH THIN FILM

BACKGROUND OF THE INVENTION

The present invention relates to a thin antiferromagnetic film with high corrosion resistance and, more particularly, to an antiferromagnetic thin film applied for restraint of Barkhausen noise of a magnetoresistance-effect element in a reproducing magnetic head for a magnetic disk apparatus or the like.

In order to prevent generation of Barkhausen noise of a magnetoresistance-effect element employing permalloy (a generic name of a Ni-Fe highly-permeable alloy containing 35 to 90 weight % of nickel), it has already been proposed to utilize a method such that a thin antiferromagnetic film is brought into contact with at least one portion of a thin permalloy film so as to restrain movement of magnetic domain walls of the permalloy by an exchange bias field generated from the exchange coupling between the permalloy film and the antiferromagnetic film (refer to JP-A-62-40610 and JP-A63-117309). An Fe-Mn alloy is used as a material for the antiferromagnetic film.

However, because one part of the magnetoresistance-effect element including an Fe-Mn alloy film is normally exposed to the atmosphere, weakness in corrosion resistance of the Fe-Mn alloy causes a problem. The above-mentioned prior method lacks practicality because of the poor corrosion resistance of the Fe-Mn alloy.

It has also been proposed for improving the corrosion resistance of the Fe-Mn alloy, to add Ti, Rh, Cr or the like to that alloy (refer to JP-A-63-273372 and JP-A-1-21389); however, the corrosion resistance of the Fe-Mn alloy to which Ti, Rh, Cr or the like is added, is not still satisfactory and it is therefore desired to further improve the Fe-Mn alloy in corrosion resistance.

SUMMARY OF THE INVENTION

A primary object of the invention is to prepare an Fe-Mn alloy with more improved corrosion resistance than the Fe-Mn alloy containing Ti, Rh, or Cr, to thereby provide a thin antiferromagnetic film having high practicality in use. Additionally, the term "Fe-Mn alloy" used in this specification means an alloy which can be put into practical use as an antiferromagnetic material and in which an atomic percentage ratio of Mn to Fe is within a range of from 15/85 to 70/30 (if the Fe-Mn alloy is an Fe-Mn binary alloy, a content of Mn is from 15 to 70 atomic %).

According to a first aspect of the invention, when one element selected from the group consisting of Ir, Ru, Zr, Nb, Hf, Ge, V, Co, Pt and Pd is added as a third alloying element X by 0.1 to 20 atomic % to Fe and Mn, which are essential components of the Fe-Mn alloy, corrosion resistance of the Fe-Mn alloy is improved. Among others, when Ir or Ru is added to an Fe-Mn alloy, corrosion resistance of the alloy is improved more remarkably.

The third alloying element X is added in such a manner that it does not deteriorate a characteristic of an Fe-Mn based alloy as an antiferromagnetic material, so that corrosion resistance of the Fe-Mn based alloy can be improved. The third alloying element X exists in a form of solid solution in the Fe-Mn based alloy, and it forms a stable oxide coating-film containing the third alloying element X as a main component in an oxidizing atmosphere or changes characteristics of the Fe-Mn based alloy itself so as to improve the corrosion resistance of the alloy. It is recommended that Ir and Ru are added to the Fe-Mn based alloy by 4 to 15 atomic % and by 5.5 to 15 atomic %, respectively, as the third alloying element X.

According to a second aspect of the invention, corrosion resistance of an Fe-Mn-X alloy is more improved, by adding thereto at least one element selected from the group consisting of Ru, Rh, Pt, Ti, Zr, Hf, V, Nb, Ta, Cr, Mo, W, Ni, Cu, Al, Si and Ge as another additive element.

In the case where the third alloying element X is Ir, at least one element selected from Ru, Rh and Pt is added to an Fe-Mn-Ir alloy and a total amount of the elements (including Ir) added to Fe-Mn is predetermined at 4 to 15 atomic %, thereby providing an antiferromagnetic thin film that is more superior in corrosion resistance and has a high exchange bias field. When improving corrosion resistance of the Fe-Mn-Ir alloy, it is more effective to add thereto at least one element selected from the group consisting of Ti, Zr, Hf, V, Nb, Ta, Cr, Mo, W, Ni and Cu by 0.1 to 2 atomic %.

When the third alloying element X is Ru, Rh and/or Pt is added to a Fe-Mn-Ru alloy and a total amount of the elements (including Ru) added to the Fe-Mn alloy is predetermined at 5.5 to 15 atomic %, thereby providing an antiferromagnetic thin film that is more excellent in corrosion resistance than the Fe-Mn-Ru alloy and has a high exchange bias field. It is more effective to add at least one element selected from the group consisting of Ti, Zr, Hf, V, Nb, Ta, Cr, Mo, W, Ni, Cu, Al, Si and Ge by 0.1 to 2 atomic % to the Fe-Mn-Ru alloy.

If the thin antiferromagnetic film thus improved in corrosion resistance is provided on at least one portion of the magnetoresistance-effect element, the magnetoresistance-effect element does not to cause Barkhausen noise. When the magneto-resistance-effect element is applied to at least one portion of a magnetic head, a highly sensitive magnetic head with less Barkhausen noise can be obtained. Further, if shielding layers or recording magnetic poles in the magnetic head are made of a two-layer film consisting of a soft magnetic film and an antiferromagnetic film, since the magnetic domain structure is realized with a good reappearance property after the head performs a recording operation, the output of the magnetoresistance-effect head (MR head) is uniformly produced so that the head outputs the signal in equilibrium.

These and other features of the invention will become clear from the following description of the preferred embodiments with reference to the drawings.

BRIEF DESCRIPTION OF THE DRAWINGS

FIG. 7 is a view illustrative of a structure of a magnetic head in which the thin antiferromagnetic films according to the invention are layered on shielding layers and recording magnetic poles;

DESCRIPTION OF THE PREFERRED EMBODIMENTS

Example 1

An ion beam sputtering apparatus was employed for producing a thin antiferromagnetic film and a thin permalloy film, and the sputtering operation was performed under such conditions as to be described below.

Ion gas . . . Ar

Pressure of Ar gas in the apparatus . . . $2.5 \times 10^{-2}$ Pa

Acceleration voltage of the ion gun for deposition . . . 400 V

Ion current of the ion gun for deposition . . . 60 mA

Distance between the target and the substrates . . . 127 mm

A 7059 glass manufactured by CORNING INCORPORATED was used for a substrate. A plurality of samples were prepared, the samples being formed by respectively superposing a thin conventional Fe-Mn alloy film having a thickness of 50 nm, a thin film made of an alloy obtained by adding Ti, Rh or Cr to the Fe-Mn alloy, and a thin Fe-Mn-Ir alloy film, the substrates which were previously provided with thin permalloy films each having a thickness of 40 nm.

The formed thin films were exposed for seven days in on environment wherein the temperature was 60° C. and the humidity was 90%, and the corrosion resistances of the respective thin films were compared. The corrosion resistance of each thin film was evaluated on the basis of a ratio of an exchange bias field before execution of the corrosion resistance test to that after execution of the test, the exchange bias field being applied to the permalloy thin film from the Fe-Mn alloy. When the ratio is 1.0, it is shown that the exchange bias field is not changed even if the above-described test in which the temperature and the humidity are maintained at certain values is executed. When the ratio is zero, it is shown that the Fe-Mn alloy thin film is corroded completely so that the bias magnetic field disappears during execution of the above test.

Figure 1:
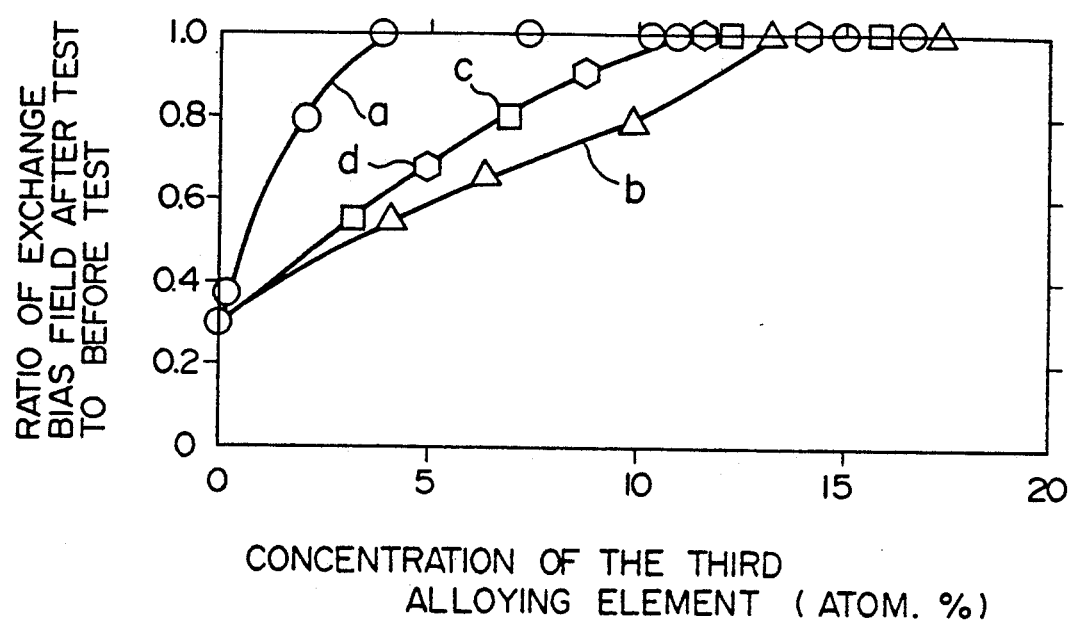
FIG. 1 is a graph showing a result of a corrosion resistance test on a thin antiferromagnetic film made of an Fe-Mn-Ir alloy according to the invention and the conventional thin antiferromagnetic films.

FIG. 1 shows a relation between concentration of Ir added to the Fe-Mn alloy and the above-described ratio of the exchange bias field of the Fe-Mn alloy before execution of the test to that after execution of the test. As will be understood from a curved line a indicating a change of the corrosion resistance of the Fe-Mn alloy to which Ir is added, in the Fe-Mn alloy having 0% of Ir, that is, to which Ir is not added, the corrosion resistance is weak and the exchange bias field is reduced to an extent of 30%. In contrast, when Ir of 0.1 atomic % or more is added to the Fe-Mn alloy, the corrosion resistance thereof is improved. Further, the thin film of the alloy to which Ir of 4 atomic % or more is added is not corroded at all so that the exchange bias field applied to the permalloy thin film is not changed.

It was understood from the test result that the alloy obtained by adding Ir to the Fe-Mn alloy is more excellent in corrosion resistance than the alloy to which Ir is not added. As clearly seen in FIG. 1, the corrosion resistance of the alloy to which Ir is added can be improved by a smaller amount than each alloy to which Ti, Rh, or Cr is added.

Though a composition ratio of Fe to Mn in the Fe-Mn alloy is about 5 to 4, since the Fe-Mn alloy is antiferromagnetic, the corrosion resistance of the Fe-Mn alloy is improved owing to the addition of Ir, similarly to the above-described embodiment, even if the composition ratio of Fe to Mn is changed.

In this embodiment, the Fe-Mn alloy film is formed on the thin permalloy film. However, as long as the Fe-Mn alloy is antiferromagnetic, such effect as to be similar to this embodiment can be obtained even when the Fe-Mn alloy film is formed before provision of the thin permalloy film.

Further, the ion beam sputtering method is used for producing the thin film in this embodiment, whereas a similar effect can be obtained by another method for thin film formation such as a high-frequency sputtering method, a direct-current sputtering method, a vapor deposition method or the like.

Example 2

Figure 2:
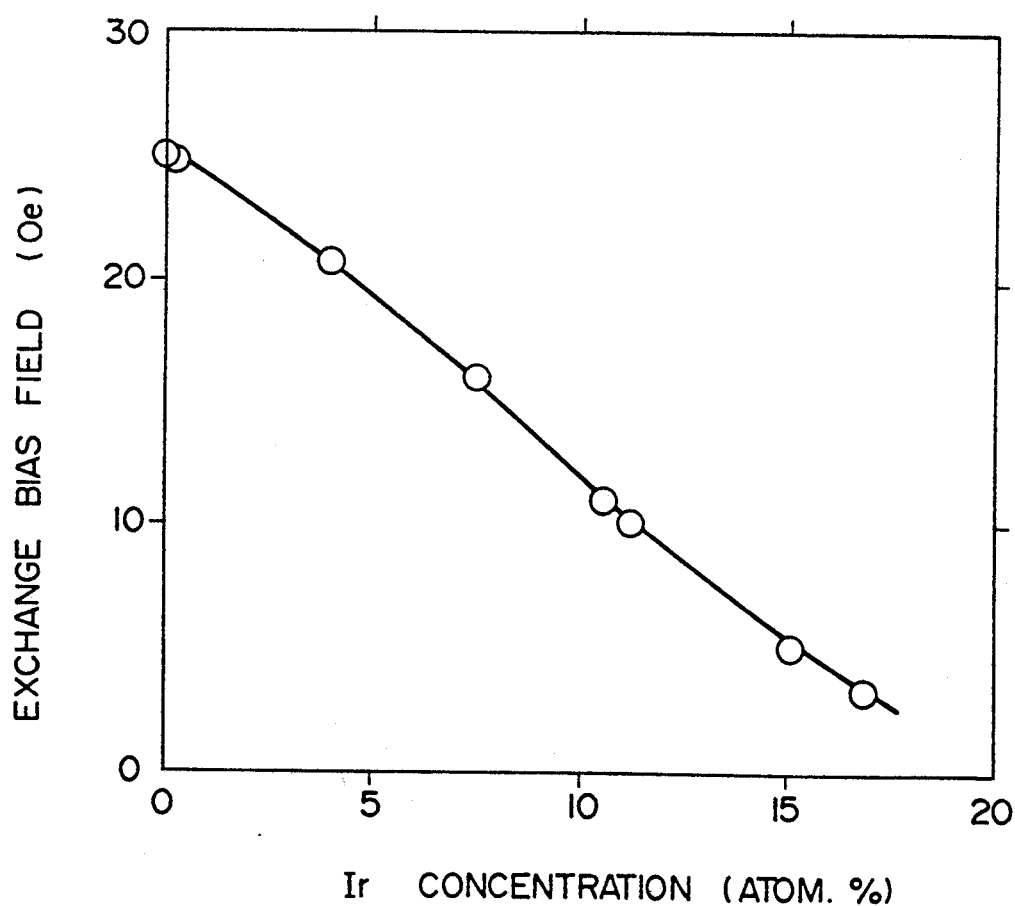
FIG. 2 is a graph showing a relation between Ir concentration and exchange bias field of the thin antiferromagnetic film of the Fe-Mn-Ir alloy according to the invention.

A test sample in which a thin film of Fe-Mn-Ir alloy was layered on a permalloy thin film was produced by a method similar to the Example 1. FIG. 2 shows a relation between exchange bias field applied to the thin permalloy film from the Fe-Mn alloy and concentration of an additive element Ir. As shown in FIG. 2, when Ir is added to the Fe-Mn alloy, the exchange bias field is decreased. If the concentration of Ir is predetermined at 15 atomic % or less, the exchange bias field of 5 Oe or more can be obtained. It was understood from Example 1 that preferable corrosion resistance is achieved when Ir is added to the Fe-Mn alloy by 4 atomic % or more. Accordingly, in order to obtain both of the preferable corrosion resistance and the exchange bias field of not less than 5 Oe, it is favorable that the concentration of Ir is within a range of from 4 to 15 atomic %.

Referring to FIG. 2, for the purpose of obtaining an exchange bias field of not less than 10 Oe, it is required to predetermine the concentration of Ir is not more than 11 atomic %. Consequently, in order to obtain both of the preferable corrosion resistance and the exchange bias field of not less than 10 Oe, it is favorable that the concentration of Ir is within a range of from 4 to 11 atomic %.

Referring again to FIG. 2, for the purpose of obtaining an exchange bias field of not less than 15 Oe, it is required to predetermine that the concentration of Ir not more than 7.5 atomic %. Consequently, in order to obtain both of the preferable corrosion resistance and the exchange bias field of not less than 15 Oe, it is favorable that the concentration of Ir is within a range of from 4 to 7.5 atomic %.

In this second example, the Fe-Mn alloy film is formed on the thin permalloy film. However, since the Fe-Mn alloy is antiferromagnetic, such effect as to be similar to this example can be obtained even when the Fe-Mn alloy film is formed before provision of the thin permalloy film.

Further, the ion beam sputtering method is used for producing the thin film in this example, whereas a similar effect can be also obtained by another method for thin film formation such as a high-frequency sputtering method, a direct-current sputtering method, a vapor deposition method or the like.

Example 3

A thin film of an alloy obtained by adding Ru, Rh, or Pt to the Fe-Mn-Ir alloy was formed on a permalloy thin film by a method similar to Example 1. A concentration of Ir was predetermined at 7.5 atomic % and a concentration of Ru, Rh, or Pt was at 3.0 atomic %. For comparison with the above thin film, a thin film of Fe-Mn-Ir alloy to which Ir was added by 10.5 atomic % was formed on the thin permalloy film.

The formed thin films were exposed for fourteen days in an environment wherein the temperature was 60° C. and the humidity was 90%, and the corrosion resistances of the respective thin films were compared. The corrosion resistance was evaluated on the basis of a ratio of an exchange bias field before execution of the corrosion resistance test to that after execution of the test, the exchange bias field being applied from the Fe-Mn-Ir alloy to the permalloy thin film.

There is shown in Table 1 a relation between an additive element and the ratio of the exchange bias field before the test to that after the test.

TABLE 1

| Added Alloying Element | Ratio of Exchange Bias Field Before Test to That After Test |
|---|---|
| — | 0.75 |
| Ru | 1.00 |
| Rh | 0.90 |
| Pt | 0.85 |

As shown in Table 1, the corrosion resistance is more improved by adding Ru, Rh, or Pt to the Fe-Mn-Ir alloy. Because the exchange bias field is decreased by addition of Ru, Rh, or Pt in a way similar to the case of adding Ir, in order to obtain both of preferable corrosion resistance and an exchange bias field of 5 Oe or more, it is desirable that the total concentration of Ir and the additive element is within a range of from 4 to 15 atomic %.

Further, in order to obtain both of the preferable corrosion resistance and the exchange bias field of not less than 10 Oe, it is favorable that the total concentration of Ir and the additive element is within a range of from 4 to 11 atomic %. For obtaining the preferable corrosion resistance as well as the exchange bias field of not less than 15 Oe, it is favorable that the total concentration of Ir and the additive element is within a range of from 4 to 7.5 atomic %.

Incidentally, in this example, the Fe-Mn-Ir alloy film is formed on the thin permalloy film. However, as long as the Fe-Mn-Ir alloy is antiferromagnetic, such effect as to be similar to this example can be obtained even when the Fe-Mn-Ir alloy film is formed before provision of the thin permalloy film.

Additionally, the ion beam sputtering method is used for producing the thin film in this example, whereas a similar effect can be obtained by another method for thin film formation such as a high-frequency sputtering method, a direct-current sputtering method, a vapor deposition method or the like.

Example 4

By a method similar to Example 1, formed on thin permalloy films were thin films made of alloys obtained by adding Ti, Zr, Hf, V, Nb, Ta, Cr, Mo, W, Ni and Cu to the Fe-Mn-Ir alloy, respectively. The concentration of Ir was predetermined at 7.5 atomic % and the concentration of each additive element was at 2 atomic %.

The formed thin films were exposed for fourteen days in an environment wherein the temperature was 60° C. and the humidity was 90%, and the corrosion resistances thereof were compared. The corrosion resistance was evaluated on the basis of a ratio of an exchange bias field before execution of the corrosion resistance test to that after execution of the test, the exchange bias field being applied from the Fe-Mn-Ir alloy to the thin permalloy film.

A relation between the additive element and the ratio of the exchange bias field before the test to that after the test is shown in Table 2.

TABLE 2

| Added Alloying Element | Ratio of Exchange Bias Field Before Test to That After Test |
|---|---|
| — | 0.75 |
| Ti | 0.95 |
| Zr | 0.95 |
| Hr | 1.00 |
| V | 0.90 |
| Nb | 0.90 |
| Ta | 0.95 |
| Cr | 0.95 |
| Mo | 0.85 |
| W | 0.80 |
| Ni | 1.00 |
| Cu | 0.95 |

As Table 2 indicates, the corrosion resistance is more improved by adding Ti, Zr, Hf, V, Nb, Ta, Cr, Mo, W, Ni or Cu to the Fe-Mn-Ir alloy. The additive element is effective in improving the corrosion resistance when the concentration of the additive element is 0.1 atomic % or more. Also, the corrosion resistance of the Fe-Mn-Ir alloy when the concentration of the additive element is more than 2 atomic % is generally equal to the corrosion resistance when the concentration of the additive element is 2 atomic %. The exchange bias field is decreased substantially in proportion to the amount of the additive element. As can be recognized from the above result, it is preferable that the amount of addition of Ti, Zr, Hf, V, Nb, Ta, Cr, Mo, W, Ni or Cu is within a range of from 0.1 to 2 atomic %.

In this example, the Fe-Mn-Ir alloy film is formed on the thin permalloy film. However, as long as the Fe-Mn-Ir alloy is antiferromagnetic, such effect as to be similar to this example can be obtained even when the Fe-Mn-Ir alloy film is formed before provision of the thin permalloy film.

Further, the ion beam sputtering method is used for producing the thin film in this example, whereas a similar effect can be obtained by another method for thin film formation such as a high-frequency sputtering method, a direct-current sputtering method, a vapor deposition method or the like.

Example 5

Magnetoresistance-effect elements were produced employing the samples formed by layering the Fe-Mn alloy films on the thin permalloy films which were described in the above examples 1 to 4. When changes in outputs of the magnetoresistance-effect elements due to the magnetic fields applied thereto were examined, it was confirmed that magnetoresistance-effect elements that cause less Barkhausen noise can be obtained.

Moreover, in a magnetic head employing the above magnetoresistance-effect element, a distortion of a reproduction wave form because of the Barkhausen noise was not found.

Example 6

An ion beam sputtering apparatus was employed for producing a thin antiferromagnetic film and a thin permalloy film, and the sputtering operation was performed under such conditions as to be described below.

Ion gas . . . Ar
Pressure of Ar gas in the apparatus . . . $2.5 \times 10^{-2}$ Pa
Acceleration voltage of the ion gun for deposition . . . 400 V
Ion current of the ion gun for deposition . . . 60 mA
Distance between the target substrates . . . 127 mm A 7059 glass manufactured by CORNING INCORPORATED was used for a substrate. A plurality of samples were prepared, the samples being formed by laying a conventional Fe-Mn alloy film having a thickness of 50 nm, a thin film made of an alloy obtained by adding Ti, Rh or Cr to the Fe-Mn alloy, and an Fe-Mn-Ru alloy film, respectively on the substrates which were previously provided with the thin permalloy films each having a thickness of 40 nm. The amounts of addition of Ru, Ti, Rh, and Cr were respectively predetermined at 8.4, 12.5, 12.0, and 10.0 atomic %.

The formed thin films were exposed in an environment wherein the temperature was 60° C. and the humidity was 90%, and the corrosion resistances of the respective thin films were compared. The corrosion resistance of each thin film was evaluated on the basis of a ratio of an exchange bias field before execution of the corrosion resistance test to that after execution of the test, the exchange bias field being applied to the permalloy thin film from the Fe-Mn alloy. When the ratio was 1.0, it was shown that the exchange bias field is not changed even if the above-described test in which the temperature and humidity are maintained at the certain values is executed. When the ratio is zero, it is shown that the Fe-Mn alloy thin film is completely corroded so that the exchange bias field disappears during execution of the above test.

Figure 3:
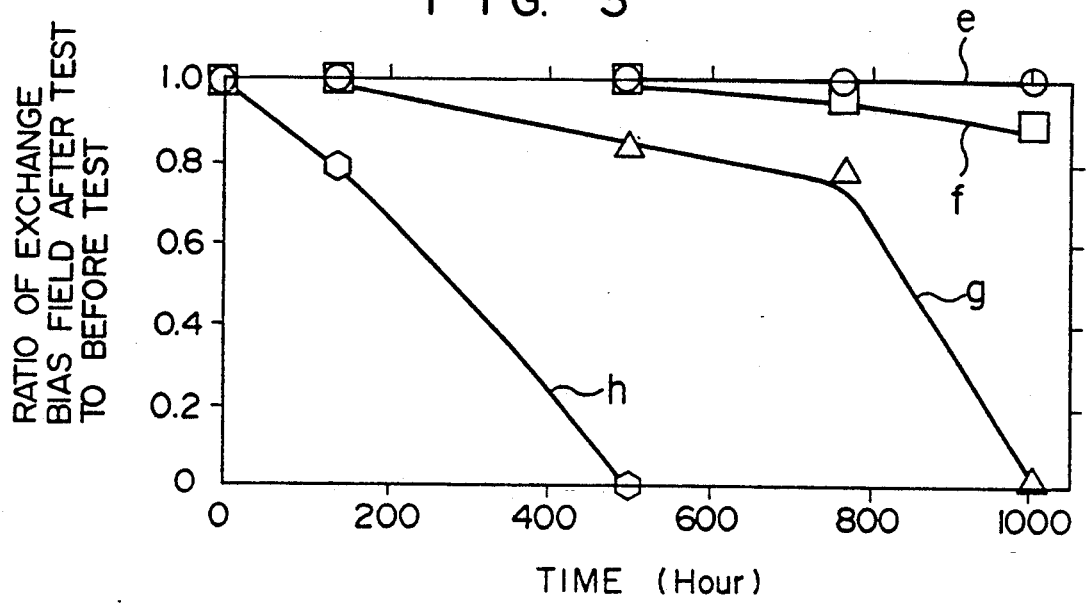
FIG. 3 is a graph showing a result of a corrosion resistance test on a thin antiferromagnetic film made of an Fe-Mn-Ru alloy according to the invention and the conventional thin antiferromagnetic films.

FIG. 3 shows a relation between a test time and a ratio of an exchange bias field before the test to that after the test, the test being executed on the Fe-Mn-Ru alloy according to the invention (see the curved line e) and those of the thin films made of the alloys obtained by respectively adding Ti, Rh, and Cr to the Fe-Mn alloy. In FIG. 3, reference f represents the relation of the Rh-added alloy thin film, reference q represents that of the Cr-added alloy thin film, and reference h represents that of the Ti-added alloy thin film. When the test in which the temperature and the humidity are maintained at the certain values is executed on the conventional alloy thin films which are disclosed in Japanese Patent Application Nos. 63-273372 and 1-213819, the thin films are corroded and the exchange bias fields thereof are decreased. In contrast, the Ru-added alloy of the invention designated by reference e is not corroded, and even if the test time exceeds 1,000 hours, no change occurs in a surface of the thin film.

Figure 4:
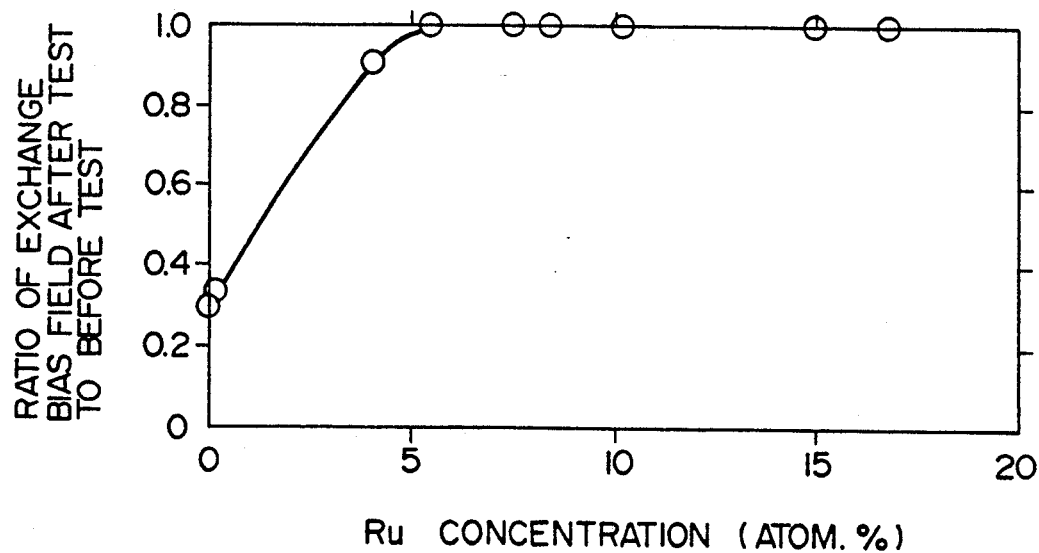
FIG. 4 is a graph showing a relation between Ru concentration and corrosion resistance of the thin antiferromagnetic film of the Fe-Mn-Ru alloy according to the invention.

FIG. 4 shows a relation between a concentration of Ru added to the Fe-Mn alloy and the ratio of the exchange bias field before execution of the test to that after execution of the test. As be understood from the figure, in the Fe-Mn alloy having 0% of Ru, that is, to which Ru is not added, the corrosion resistance is weak and the exchange bias field is reduced to an extent of 30% owing to the test in which the temperature and the humidity are maintained at the certain value. In contrast, when Ru of 0.1 atomic % or more is added to the Fe-Mn alloy, the corrosion resistance is improved. Further, the thin film of the alloy to which Ru of 5.5 atomic % or more is added is not corroded at all so that the exchange bias field applied to the thin permalloy film is not changed. It was understood from the test result that the alloy obtained by adding Ru to the Fe-Mn alloy is more excellent in corrosion resistance than the alloy to which Ru is not added.

Since the Fe-Mn alloy is prone to be oxidized, when the thin film made of the Fe-Mn alloy is exposed to the air after being manufactured, oxygen is dispersed in the thin film. In this case, the corrosion resistance of the thin film is improved by the additive element similarly to the above-described example.

Incidentally, though a composition ratio of Fe to Mn in the Fe-Mn alloy is about 5 to 4, as far as the Fe-Mn alloy is antiferromagnetic, the corrosion resistance of the Fe-Mn alloy is improved by the additive element similarly to the afore said example, even if the composition ratio of Fe to Mn is changed.

In this example, the Fe-Mn alloy film is formed on the thin permalloy film. However, as far as the Fe-Mn alloy is antiferromagnetic, such effect as to be similar to this example can be obtained even when the Fe-Mn alloy thin film is formed before provision of the thin permalloy film.

Additionally, the ion beam sputtering method is used for producing the thin film in this example, whereas a similar effect can be obtained by another method for thin film formation such as a high-frequency sputtering method, a direct-current sputtering method, a vapor deposition method or the like.

Example 7

Figure 5:
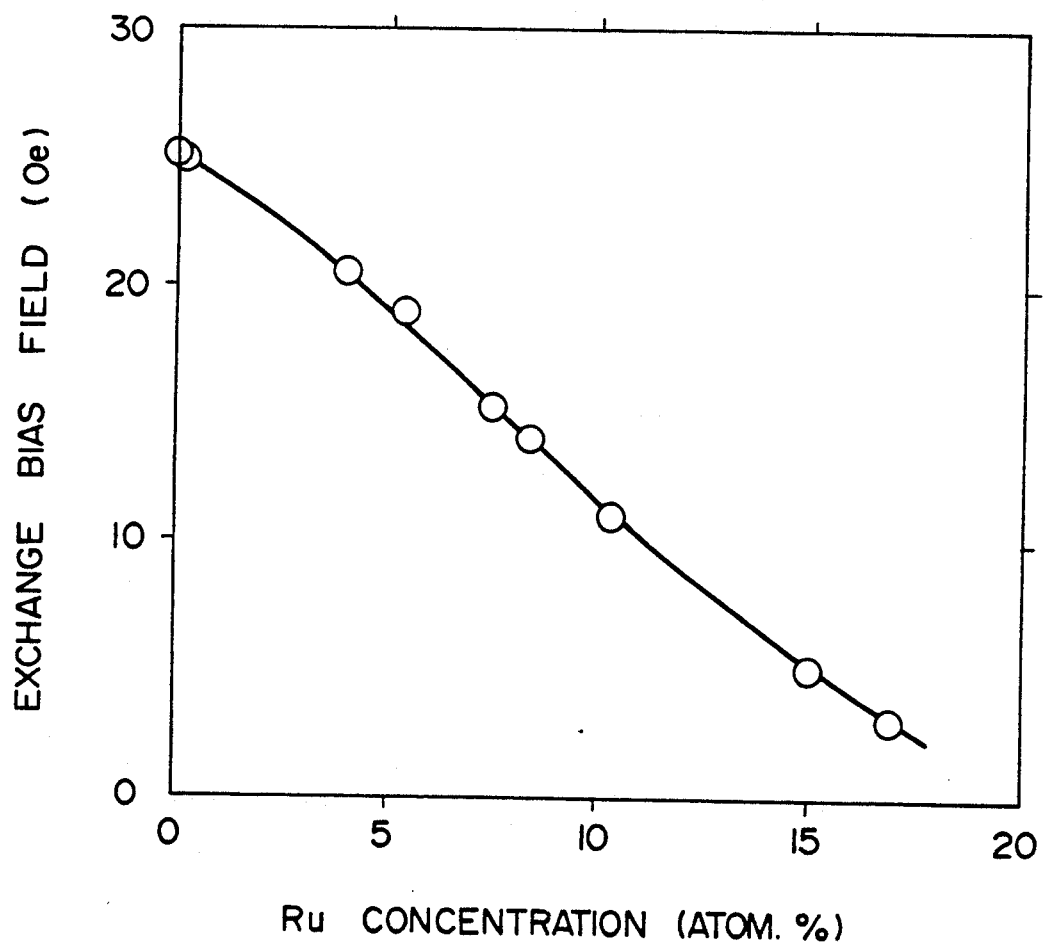
FIG. 5 is a graph showing a relation between Ru concentration and exchange bias field of the thin antiferromagnetic film of the Fe-Mn-Ru alloy according to the invention.

A sample in which a thin film of Fe-Mn-Ru alloy was superposed on a thin permalloy film was produced by a method similar to the example 6. FIG. 5 shows a relation between an exchange bias field applied to the thin permalloy film from the Fe-Mn-Ru alloy and a concentration of an additive element Ru. As shown in FIG. 5, when Ru is added to the Fe-Mn alloy, the exchange bias field is decreased. If the concentration of Ru is predetermined at 15 atomic % or less, the exchange bias field of 5 Oe or more can be obtained. It was understood from the example 6 that preferable corrosion resistance is achieved when Ru is added to the Fe-Mn alloy by 5.5 atomic % or more. Accordingly, in order to obtain both of the preferable corrosion resistance and the exchange bias field of 5 Oe or more, it is favorable that the concentration of Ru is within a range of from 5.5 to 15 atomic %.

Referring to FIG. 5, for the purpose of obtaining an exchange bias field of not less than 10 Oe, it is required to predetermine the concentration of Ru not more than 10.3 atomic %. Succeedingly, in order to obtain both of the preferable corrosion resistance and the exchange bias field of not less than 10 Oe, it is favorable that the concentration ratio of Ru is within a range of from 5.5 to 10.3 atomic %.

Referring again to FIG. 5, for the purpose of obtaining an exchange bias field of not less than 15 Oe, it is required that the concentration of Ru be not more than 7.5 atomic %. Succeedingly, in order to obtain both of the preferable corrosion resistance and the exchange bias field of not less than 15 Oe, it is favorable that the concentration of Ru is within a range of from 5.5 to 7.5 atomic %.

In this seventh example, the Fe-Mn-Ru alloy thin film is formed on the thin permalloy film. However, as far as the Fe-Mn-Ru alloy is antiferromagnetic, such effect as to be similar to this example can be obtained even when the Fe-Mn-Ru alloy film is formed before provision of the thin permalloy film.

Further, the ion beam sputtering method is used for producing the thin film in this example, whereas a similar effect can be obtained by another method for thin film formation such as a high-frequency sputtering method, a direct-current sputtering method, a vapor deposition method or the like.

Since the Fe-Mn alloy is prone to be oxidized, when the thin film made of the Fe-Mn alloy is exposed in the atmosphere after being manufactured, oxygen is dispersed in the thin film. In this case, the corrosion resistance of the thin film is improved by the additive element similarly to the above-described example.

Example 8

A thin film made of an alloy obtained by adding Rh or Pt to the Fe-Mn-Ru alloy was formed on a thin permalloy film by a method similar to the example 6. The concentration of Ru was predetermined at 7.5 atomic % and the concentration ratio of Rh or Pt was at 3.0 atomic %. For comparison with the above thin film, a thin film of Fe-Mn-Ru alloy containing Ru by 10.5 atomic % was formed on a thin permalloy film.

The formed thin films were exposed for one thousand hours in the environment wherein the temperature is 85° C. and the humidity is 90%, and the corrosion resistances thereof were compared. The corrosion resistance was evaluated on the basis of a ratio of an exchange bias field before execution of the test to that after execution of the test, the exchange bias field being applied from the Fe-Mn-Ru alloy to the thin permalloy film.

A relation between the additive element and the ratio of the exchange bias field before the test to that after the test is shown in Table 3.

TABLE 3

| Added Alloying Element | Ratio of Exchange Bias Field Before Test to That After Test |
| --- | --- |
| — | 0.85 |
| Rh | 0.95 |
| Pt | 0.90 |

As shown in Table 3, the corrosion resistance is more improved by adding Rh or Pt to the Fe-Mn-Ru alloy. Because the exchange bias filed is decreased by addition of Rh or Pt in a way similar to the case of adding Ru, in order to obtain both of preferable corrosion resistance and an exchange bias field of 5 Oe or more, it is desirable that the concentration of Ru and the additive element is predetermined at 5.5 to 15 atomic % in total.

Further, in order to obtain both of the preferable corrosion resistance and the exchange bias field of 10 Oe or more, it is favorable that the concentration of Ru and the additive element is predetermined at 5.5 to 10.3 atomic %. Moreover, in order to obtain the corrosion resistance as well as the exchange bias field of not less than 15 Oe, it is favorable that the concentration of Ru and the additive element is predetermined at 5.5 to 7.5 atomic % in total.

In this example, the Fe-Mn-Ru alloy film is formed on the thin permalloy film. However, as far as the Fe-Mn-Ru alloy is antiferromagnetic, such effect as to be similar to this example can be obtained even when the Fe-Mn-Ru alloy film is formed before provision of the thin permalloy film.

Additionally, the ion beam sputtering method is used for producing the thin film in this example, whereas the similar effect can be obtained by another method for thin film formation such as a high-frequency sputtering method, a direct-current sputtering method, a vapor deposition method or the like.

Since the Fe-Mn alloy is prone to be oxidized, when the thin film made of the Fe-Mn alloy is exposed in the air after being manufactured, oxygen is dispersed in the thin film. In this case, the corrosion resistance of the thin film is improved by the additive element similarly to the above-described example.

Example 9

Thin films made of alloys respectively obtained by adding Ti, Zr, Hf, V, Nb, Ta, Cr, Mo, W, Ni, Cu, Al, Si, and Ge to the Fe-Mn-Ru alloy were formed on thin permalloy films by a method similar to the example 6. The concentration of Ru was predetermined at 7.5 atomic % and the concentration of the additive element was at 2 atomic %.

The formed thin films where exposed for one thousand hours in the environment wherein the temperature is 85° C and the humidity is 90%, and the corrosion resistances thereof were compared. The corrosion resistance was evaluated on the basis of a ratio of an exchange bias field before execution of the corrosion resistance test to that after execution of the test, the exchange bias field being applied from the Fe-Mn alloy to the thin permalloy film.

A relation between the additive element and the ratio of the exchange field before the test to that after the test is indicated in Table 4.

TABLE 4

| Added Alloying Element | Ratio of Exchange Bias Field Before Test to That After Test |
| --- | --- |
| — | 0.80 |
| Ti | 0.90 |
| Zr | 0.90 |
| Hf | 0.95 |
| V | 0.95 |
| Nb | 0.90 |
| Ta | 0.95 |
| Cr | 1.00 |
| Mo | 0.85 |
| W | 0.90 |
| Ni | 1.00 |
| Cu | 0.95 |
| Al | 0.95 |

TABLE 4-continued

| Added Alloying Element | Ratio of Exchange Bias Field Before Test to That After Test |
|---|---|
| Si | 0.90 |
| Ge | 0.90 |

As indicated in Table 4, the corrosion resistance of the Fe-Mn-Ru alloy is improved by adding thereto Ti, Zr, Hf, V, Nb, Ta, Cr, Mo, W, Ni, Cu, Al, Si, or Ge. The above-described additive element is effective in improving the corrosion resistance when the concentration thereof is 0.1 atomic % or more. Even if the concentration of the additive element is more than 2 atomic %, the corrosion resistance of the Fe-Mn-Ru alloy is generally the same as when the concentration of the additive element is 2 atomic %. The exchange bias field is decreased substantially in proportion to the amount of the additive element. As a result, it is preferable that the amount of addition of Ti, Zr, Hf, V, Nb, Ta, Cr, Mo, W, Ni, Cu, Al, Si, or Ge is within a range of from 0.1 to 2 atomic %.

In this example, the Fe-Mn-Ru alloy film is formed on the thin permalloy film. However, as far as the Fe-Mn-Ru alloy is anti-ferromagnetic, such effect as to be similar to this example can be obtained even when the Fe-Mn-Ru alloy film is formed before provision of the thin permalloy film.

Further, the ion beam sputtering method is used for producing the thin film in this example, whereas the similar effect can be obtained by another method for thin film formation such as a high-frequency sputtering method, a direct-current sputtering method, a vapor deposition method or the like.

Moreover, since the Fe-Mn alloy is prone to be oxidized, when the thin film made of the Fe-Mn alloy is exposed in the air after being manufactured, oxygen is dispersed in the thin film. In this case, the corrosion resistance of the thin film is improved by the additive element similarly to the above-described example.

Example 10

Magnetoresistance-effect elements were manufactured with employing the samples in which the Fe-Mn-Ru alloy films are layered on the thin permalloy films which were described in the examples 6 to 9. When a change in an output of each magnetoresistance-effect element owing to a magnetic field applied thereto was examined, it was confirmed that such magnetoresistance-effect element causing less Barkhausen noise can be obtained.

Example 11

Figure 6:
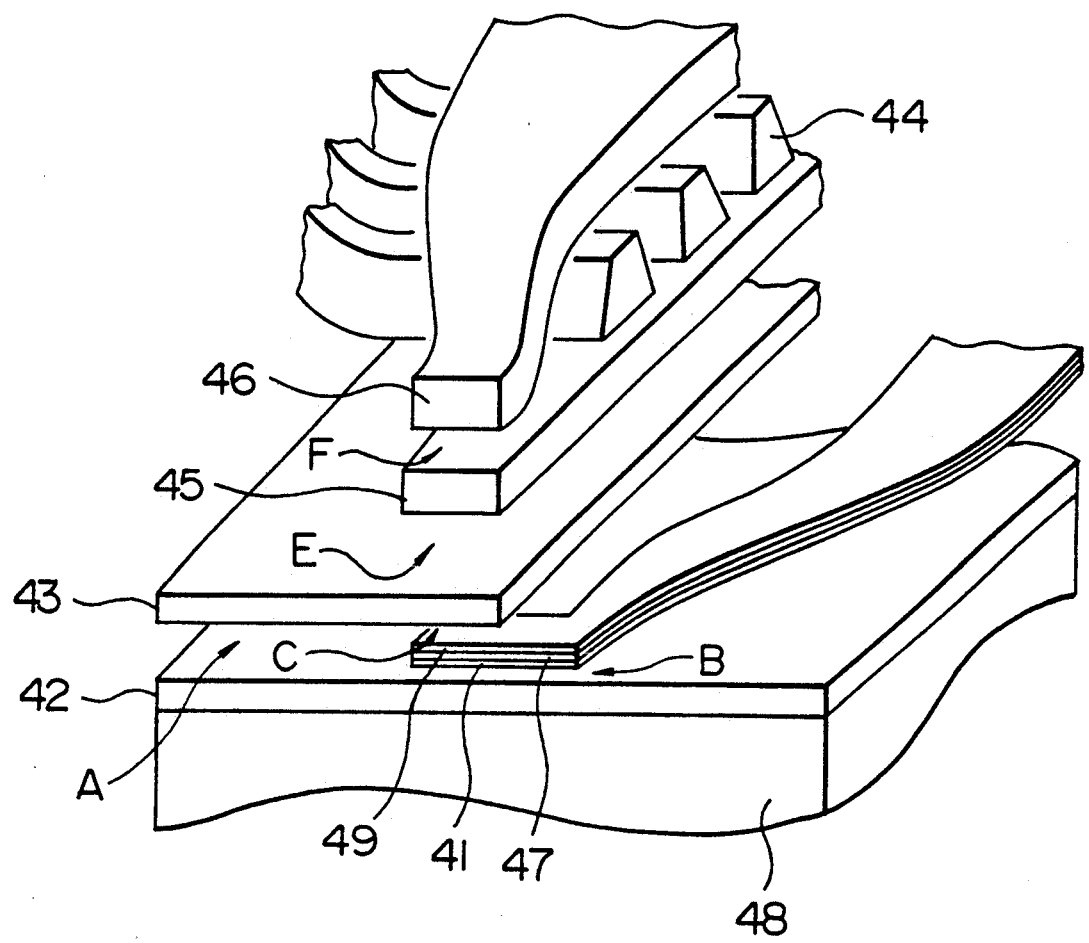
FIG. 6 is a view illustrative of a structure of a magnetic head in which the thin antiferromagnetic film of the Fe-Mn-Ru alloy according to the invention is layered on a magnetoresistance-effect element.

A magnetic head having a magnetoresistance-effect element including an Fe-Mn-X alloy film according to the invention was produced. Fe-Mn-Ru alloy containing Ru by 8.4 atomic % will be described in this example. The magnetic head is constructed in such a manner as to be stated below. FIG. 6 is a perspective view of a reading and writing head of a separation type, one part thereof being cut out. A magnetoresistance-effect element 41 interposed between shielding layers 42 and 43 operates as a reading head, and two recording magnetic poles 45 and 46 interposing a coil 44 therebetween operate as a writing head. The magnetoresistance-effect element 41 comprises two layers of a soft magnetic film having a magnetoresistance-effect and an antiferromagnetic film 47 made of the Fe-Mn-Ru alloy. A method of producing this head will be described hereinafter.

A sintered material including $Al_2O_3 \cdot TiC$ as a main component was used for a substrate 48 for a slider. The shielding layers and the recording magnetic poles were made of Ni-Fe alloy by the sputtering method. The soft magnetic film of the magnetoresistance-effect element was formed of the Ni-Fe alloy by the vapor deposition method. The antiferromagnetic film 47 was made of the Fe-Mn-Ru alloy by the ion beam sputtering method. Thickness of the upper and the lower shielding layers 42 and 43, the recording magnetic poles 45 and 46, and the magnetoresistance-effect element were 1.0 $\mu$m, 3.0 $\mu$m, and 30 nm, respectively. A thickness of the antiferromagnetic Fe-Mn-Ru alloy film 47 was 20 nm. A material for being filled in gaps defined between the respective adjacent layers was formed of $Al_2O_3$ by the sputtering method. A thickness of a layer filled in the gap between the magnetoresistance-effect element and the shielding layer was 0.2 $\mu$m, and a thickness of a layer filled in the gap between the two recording magnetic poles was 0.4 $\mu$m. A distance between the reading head and the writing head was selected at about 4 $\mu$m. A layer interposed between the reading head and the writing head was made of $Al_2O_3$. A film of Cu with a thickness of 3 $\mu$m was used for the coil 44. Incidentally, a resin, glass or ceramic material may be employed as the material for being filled in the gaps.

In order to operate the magnetoresistance-effect element as the head, means for applying a bias magnetic field thereto is required, and a shunt-bias method was employed in this example. A Ti-film having a thickness of 40 nm which operates as a conductor layer was formed on the antiferromagnetic Fe-Mn-Ru alloy film 47 located on the magnetoresistance-effect element. An electrical current shunted on to the Ti-film generates a bias magnetic field.

It is an important point in producing the magnetic head in the above-mentioned manner to exchange-coupled the soft magnetic film and the anti-ferromagnetic Fe-Mn-Ru alloy film so as to control a magnetic domain structure of the soft magnetic film. During a process of producing the head, the temperature sometimes rises higher than the Neel temperature of the Fe-Mn alloy so that the magnetic domain structure of the soft magnetic film becomes complicated. When the temperature is lowered again, the complicated structure of the magnetic domain of the soft magnetic film is fixed. Thus, it is difficult to obtain a stable output from the head. For prevention of this, it is preferable to form the magnetic domain structure of the soft magnetic film into a desired one by conducting a heat-treatment in the magnetic field at the finish of the process of producing the head. In this example, such heat-treatment was executed such that after the temperature was raised up to 220° C. while a magnetic field of about 10 kOe was applied in a direction of a track width, the temperature was returned to the room temperature.

When a writing and reading characteristic of this head was measured, a distortion of a reproduced waveform due to Barkhausen noises was not found. Though the shunt bias method is employed as a bias method for the MR head in the above-described example, a similar effect can be obtained even when another method such as a soft film bias or coupled film bias method which is conventionally known, is used. Further, in this example, a layer in which the MR film and the shunt film are superposed are also used as an electrode line for detection, whereas the electrode line may be superposed separately from the MR film and the shunt film. Moreover, though such a case where the antiferromagnetic film is provided on an overall surface of the magnetoresistance-effect element is shown in FIG. 6, an effect of controlling the magnetic domain can be obtained even when the antiferromagnetic film is provided partially, for example, on both end portions of the element.

Even if the antiferromagnetic film is formed of another Fe-Mn-X alloy according to the invention which is described in the examples 6 to 9, the effect of controlling the magnetic domain structure can be obtained.

Example 12

A magnetic head in which thin films of the Fe-Mn-X alloy of the invention were layered on magnetic shields and recording magnetic poles by a method similar to the example 11, was produced. A case where the Fe-Mn-Ru alloy containing Ru by 8.4 atomic % is employed will be described, with reference to this example.

FIG. 7 is a perspective view of a reading and writing head of a separating type, one portion thereof being cut out. Referring to FIG. 7, the magnetic head of this example comprises a magnetoresistance-effect element 51, shielding layers 52 and 53, a coil 54, recording magnetic poles 55 and 56, Fe-Mn-Ru alloy antiferromagnetic films 57, a substrate 58, and a conductor layer 59. The anti-ferromagnetic films 57 are respectively layered on the shielding layers 52, 53 and the recording magnetic poles 55, 56. This example provides such a result that an output of the MR head is not changed so that a stable output can be obtained because the same magnetic domain structure is realized reproducibly after the head performs a recording operation, by forming each of the shielding layers and the recording magnetic poles in two-layer films comprising a soft magnetic film and an anti-ferromagnetic film.

The above-described effect of controlling the magnetic domain can be obtained, even if the anti-ferromagnetic film is made of another Fe-Mn-X alloy which is described in the examples 6 to 9.

In addition, even when the anti-ferromagnetic films are layered on either of the shielding layers or the recording magnetic poles, the above effect can be obtained.

Example 13

A film with a thickness of about 50 nm made of alloy including Fe, Mn of 47 atomic % and Zr of 3 atomic % was formed on a glass substrate by sputtering. A film made of alloy including Fe and Mn of 50 atomic % was formed by a method the same as the above, as a comparative sample. A corrosion resistance test was executed on the formed thin films in the environment wherein the relative humidity is 90% and the temperature is 60° C.

Figure 8:
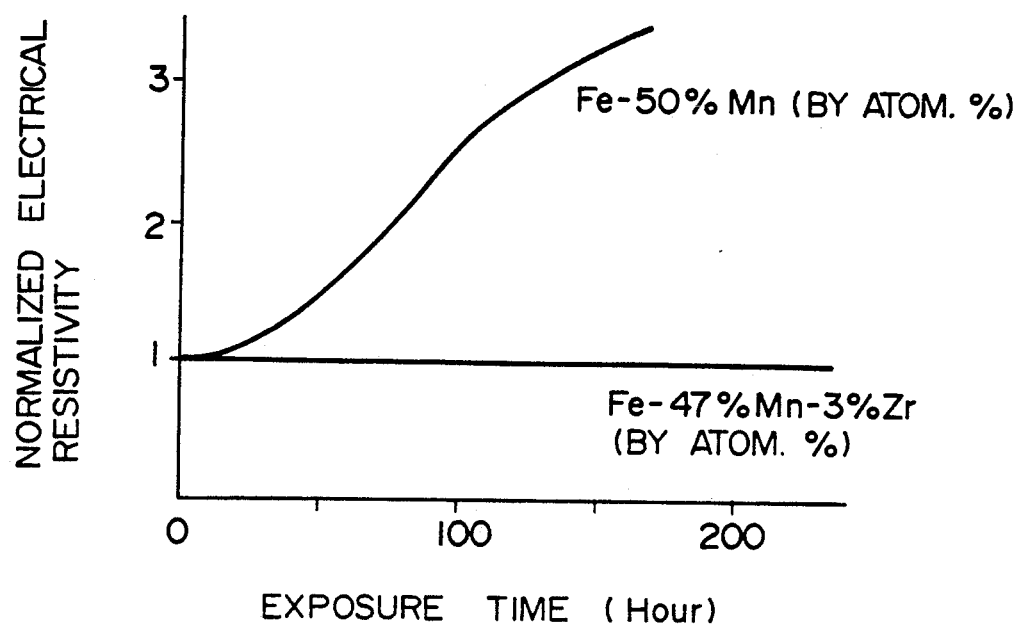
FIG. 8 is a graph showing a relation between normalized electrical resistivity and an exposed interval of time for evaluating the corrosion resistances of an Fe-Mn-Zr alloy film according to the invention and an Fe-Mn alloy film.

FIG. 8 shows a relation between a normalized electrical resistivity and an exposure time when the Fe-Mn alloy and the Fe-Mn-Zr alloy were exposed in the above-described environment. The normalized electrical resistivity of the Fe-Mn alloy is remarkably increased because of a decrease of a conductor layer owing to corrosion, while the normalized electrical resistivity of the Fe-Mn-Zr alloy to which Zr is added by 3 atomic % is not changed at all.

Meanwhile, for evaluating a characteristic as an antiferromagnetic body, two samples were formed by vapor-depositing permalloy films consisting of Ni and 18.5 atomic % of Fe in thicknesses of 50 nm on glass substrates and then sputtering the Fe-Mn alloy and the Fe-Mn-Zr alloy in thicknesses of 50 nm on the permalloy films, and bias effects of the anti-ferromagnetic films to the permalloy thin films in the two-layered samples were measured. The measured result is indicated in FIG. 9, from which it becomes clear that the anti-ferromagnetic film made of the Fe-Mn-Zr alloy performs an efficiency substantially as equal as the same made of the Fe-Mn alloy.

Figure 9:
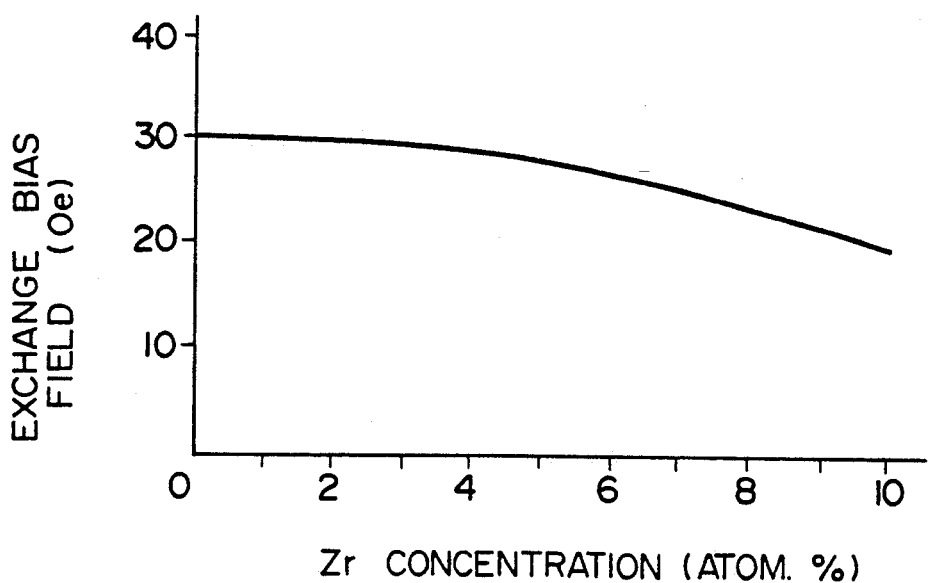
FIG. 9 is a graph showing a relation between Zr concentration in the Fe-Mn-Zr alloy and a characteristic (an exchange bias field) thereof as an antiferromagnetic material.

It was found that the maximum value of the amount of addition of Zr was 8 atomic %, for realizing an efficiency as the anti-ferromagnetic film of the Fe-Mn alloy, in other words, for restraining the decreasing intensity of the exchange bias field shown in FIG. 9 to not more than 30 atomic %, the value being sufficient for practical use. On the other hand, the minimum value of the amount of addition of Zr which is necessary for increasing the corrosion resistance was 0.5 atomic %. As seen from the above-described investigation, it is appropriate that the amount of addition of Zr is within a range of 0.5 to 8 atomic %.

Example 14

Similarly to the example 13, the corrosion resistance was improved by adding Hf to the Fe-Mn alloy.

Example 15

Similarly to the example 13, the corrosion resistance was improved by adding Nb to the Fe-Mn alloy.

The improvement in corrosion resistance which has been described in the examples 13 to 15 is realized by formation of a minute oxide film containing the additive matter as a main component on the surface of the Fe-Mn alloy film.

Example 16

A plurality of films made of Fe-Mn-X alloys wherein Pt and Pd which are platinum and noble metal groups were added to Fe-Mn alloy as an alloy element X, were formed by a method similar to the example 13, and the corrosion resistances thereof were examined. As a result, it was judged that the corrosion resistances are remarkably improved by adding Pt and Pd by 0.5 atomic % or more. This is because a layer containing the noble metal at a high concentration ratio is formed in the vicinity of the surface of the Fe-Mn-X alloy thin film.

Example 17

In the case where Ge, V, or Co was added to the Fe-Mn alloy by a method similar to the example 13, it was recognized that the corrosion resistance is 0 improved by adding the alloy element Ge, V or Co by 0.3 atomic % or more.

What is claimed is:

1. A thin antiferromagnetic film formed of an Fe-Mn-X alloy consisting essentially of Fe, Mn and a third alloying element X and disposed adjacent to a thin permalloy film in order to control a magnetic domain structure of the thin permalloy film, the thin antiferromagnetic film including Fe and Mn with an atomic percentage ratio of Mn to Fe being within a range of from 15/85 to 70/30, wherein:

the element X is Ir and the Fe-Mn-Ir alloy contains Ir within a range of from 4 to 15 atomic %; and the Fe-Mn-Ir alloy further contains at least one element selected from Ru, Rh and Pt in addition to Ir by 4 to 15 atomic % in total.

2. A thin antiferromagnetic film according to claim 1 wherein the Fe-Mn-Ir alloy further contains at least one element selected from the group consisting of Ti, Zr, Hf, V, Nb, Ta, Cr, Mo, W, Ni and Cu by 0.1 to 2 atomic %.

3. A thin antiferromagnetic film formed of an Fe-Mn-X alloy consisting essentially of Fe, Mn and a third alloying element X and disposed adjacent to a thin permalloy film in order to control a magnetic domain structure of the thin permalloy film, the thin antiferromagnetic film including Fe and Mn with an atomic percentage ratio of mn to Fe being within a range of from 15/85 to 70/30, wherein:

the element X is Ru and the Fe-Mn-Ru alloy contains Ru within a range of from 5.5 to 15 atomic %, and the Fe-Mn-Ru alloy further contains at least one of Rh and Pt in addition to Ru by 5.5 to 15 atomic % in total.

4. A thin antiferromagnetic film formed of an Fe-Mn-X alloy consisting essentially of Fe, Mn and a third alloying element X and disposed adjacent to a thin permalloy film in order to control a magnetic domain structure of the thin permalloy film, the thin antiferromagnetic film including Fe and Mn with an atomic percentage ratio of Mn to Fe being within a range of from 15/85 to 70/30, wherein:

the element X is Ru and the Fe-Mn-Ru alloy contains Ru within a range of from 5.5 to 15 atomic %, and the Fe-Mn-Ru alloy further contains at least one element selected from the group consisting of Ti, Zr, Hf, V, Nb, Ta, Cr, Mo, W, Ni, Cu, Al, Si and Ge by 0.1 to 2 atomic %.

5. A magnetoresistance-effect element including a thin antiferromagnetic film formed of Fe-Mn-X alloy consisting essentially of Fe, Mn and a third alloying element X wherein an atomic percentage ratio of Mn to Fe is within a range of from 15/85 to 70/30, wherein:

the element X is Ir, and the antiferromagnetic thin film is formed of the Fe-Mn-Ir alloy containing Ir within a range from 4 to 15 atomic %, and the Fe-Mn-Ir alloy further contains at least one element selected from Ru, Rh and Pt in addition to Ir by 4 to 15 atomic % in total.

6. A magnetic head including the magnetic-resistance-effect element according to claim 5.

7. A magnetoresistance-effect element including a thin antiferromagnetic film formed of Fe-Mn-X alloy consisting essentially of Fe, Mn and a third alloying element X wherein an atomic percentage ratio of Mn to Fe is within a range of from 15/85 to 70/30, wherein:

the element X is Ir, and the antiferromagnetic thin film is formed of the Fe-Mn-Ir alloy containing Ir within a range from 4 to 15 atomic %, and the Fe-Mn-Ir alloy further contains at least one element selected from the group consisting of Ti, Zr, Hf, V, Nb, Ta, Cr, Mo, W, Ni and Cu by 0.1 to 2 atomic %.

8. A magnetic head including the magneto-resistance-effect element according to claim 7.

9. A magnetoresistance-effect element including a thin antiferromagnetic film formed of an Fe-Mn-X alloy consisting essentially of Fe, Mn and a third alloying element X and disposed adjacent to a thin permalloy film in order to control a magnetic domain structure of the thin permalloy film, the thin antiferromagnetic film including Fe and Mn with an atomic percentage ratio of Mn to Fe being within a range of from 15/85 to 70/30, wherein:

the element X is Ru, and the antiferromagnetic thin film is formed of the Fe-Mn-Ru alloy containing Ru within a range from 5.5 to 15 atomic %, and the Fe-Mn-Ru alloy further contains at least one of Rh and Pt in addition to Ru by 5.5 to 15 atomic % in total.

10. A magnetic head including the magneto-resistance-effect element according to claim 9.

11. A magnetoresistance-effect element including a thin antiferromagnetic film formed of an Fe-Mn-X alloy consisting essentially of Fe, Mn and a third alloying element X and disposed adjacent to a thin permalloy film in order to control a magnetic domain structure of the thin permalloy film, the thin antiferromagnetic film including Fe and Mn with an atomic percentage ratio of Mn to Fe being within a range of from 15/85 to 70/30, wherein:

the element X is Ru, and the antiferromagnetic thin film is formed of the Fe-Mn-Ru alloy containing Ru within a range from 5.5 to 15 atomic %, and the Fe-Mn-Ru alloy further contains at least one selected from the group consisting of Ti, Zr, Hf, V, Nb, Ta, Cr, Mo, W, Ni, Cu, Al, Si and Ge by 0.1 to 2 atomic %.

12. A magnetic head including the magneto-resistance-effect element according to claim 11.

* * * * *